United States Patent
Wang

(10) Patent No.: US 9,503,079 B1
(45) Date of Patent: Nov. 22, 2016

(54) METHOD AND APPARATUS FOR CURRENT/POWER BALANCING

(71) Applicant: TOYOTA MOTOR ENGINEERING & MANUFACTURING NORTH AMERICA, INC., Erlanger, KY (US)

(72) Inventor: Chi-Ming Wang, Ann Arbor, MI (US)

(73) Assignee: TOYOTA MOTOR ENGINEERING & MANUFACTURING NORTH AMERICA, INC., Erlanger, KY (US)

( * ) Notice: Subject to any disclaimer, the term of this patent is extended or adjusted under 35 U.S.C. 154(b) by 0 days.

(21) Appl. No.: 14/724,408

(22) Filed: May 28, 2015

(51) Int. Cl.
*H03K 17/687* (2006.01)

(52) U.S. Cl.
CPC .................................. *H03K 17/687* (2013.01)

(58) Field of Classification Search
CPC ...................................................... H03K 17/687
See application file for complete search history.

(56) References Cited

U.S. PATENT DOCUMENTS

| | | | | |
|---|---|---|---|---|
| 2007/0290745 | A1* | 12/2007 | Vitzilaios | H03F 1/26 330/79 |
| 2012/0235663 | A1 | 9/2012 | Bayerer et al. | |
| 2013/0214842 | A1 | 8/2013 | Zeng et al. | |
| 2014/0362627 | A1 | 12/2014 | Sun et al. | |

OTHER PUBLICATIONS

Dominik Bortis, et al., "Active Gate Control for Current Balancing of Parallel-Connected IGBT Modules in Solid-State Modulators," IEEE, Transactions on Plasma Science, vol. 36, No. 5, Oct. 2008, pp. 2632-2637.
Rodrigo Alvarez, et al., "A New Delay Time Compensation Principle for Parallel Connected IGBTs," IEEE, Energy Conversion Congress and Exposition (ECCE), 2011, pp. 3000-3007.
Yang Xue, et al., "Active Current Balancing for Parallel-Connected Silicon Carbide MOSFETs," IEEE, Energy Conversion Congress and Exposition (ECCE), 2013, pp. 1563-1569.
Gangyao Wang, et al., "Dynamic and Static Behavior of Packaged Silicon Carbide MOSFETs in Paralleled Applications," Twenty-Ninth Annual IEEE, Applied Power Electronics Conference and Exposition (APEC), 2014, pp. 1478-1483.
Zheng Chen, et al., "Experimental Parametric Study of the Parasitic Inductance Influence on MOSFET Switching Characteristics," IEEE, International Power Electronics Conference (IPEC), 2010, pp. 164-169.

* cited by examiner

*Primary Examiner* — Daniel Puentes
(74) *Attorney, Agent, or Firm* — Oblon, McClelland, Maier & Neustadt, L.L.P.

(57) ABSTRACT

Aspects of the disclosure provide a power circuit that includes a first switch module and a second switch module in parallel. The first switch module has a first gate terminal, a first drain terminal and a first source terminal, and the second switch module has a second gate terminal, a second drain terminal and a second source terminal. A drain interconnection module coupled to the first drain terminal and a gate interconnection module coupled to the second gate terminal are inductively coupled to balance current flowing through the first switch module and the second switch module.

20 Claims, 5 Drawing Sheets

METHOD AND APPARATUS FOR CURRENT/POWER BALANCING

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

A power module may use parallel power components to increase power capacity. For the parallel power components, equalizing current/power among the power components provides various benefits, such as improving component utilization, saving cost, improving system reliability. In an example, to equalize current/power among parallel power components, U.S. Patent Application Publication 2012/0235663 discloses a driver circuit to provide respective gate driver signals to drive the parallel power components.

SUMMARY

Aspects of the disclosure provide a power circuit that includes a first switch module and a second switch module. The first switch module has a first gate terminal, a first drain terminal and a first source terminal. The first drain terminal is coupled to a first node via a first drain interconnection module, the first source terminal is coupled to a second node via a first source interconnection module, and the first gate terminal is coupled to a first control node via a first gate interconnection module to receive a first control signal. The second switch module has a second gate terminal, a second drain terminal and a second source terminal. The second drain terminal is coupled to the first node via a second drain interconnection module, the second source terminal is coupled to the second node via a second source interconnection module, and the second control terminal is coupled to a second control node via a second gate interconnection module to receive a second control signal. The first drain interconnection module and the second gate interconnection module are inductively coupled and the second drain interconnection module and the first gate interconnection module are inductively coupled to balance current flowing through the first switch module and the second switch module. In an example, the first drain interconnection module and the second gate interconnection module are disposed to have a negative mutual coupling coefficient and the second drain interconnection module and the first gate interconnection module are disposed to have a negative mutual coupling coefficient.

According to an aspect of the disclosure, the first drain interconnection module and the second gate interconnection module are inductively coupled and the second drain interconnection module and the first gate interconnection module are inductively coupled to balance transient current flowing through the first switch module and the second switch module when the first and second switch modules are switched on/off.

In an embodiment, the first switch module includes a first SiC metal-oxide-semiconductor field effect transistor and the second switch module includes a second SiC metal-oxide-semiconductor field effect transistor. In an example, the first switch module is on a first die and the second switch module is on a second die, and the first die and the second die are assembled in a package face to face.

Aspects of the disclosure provide a method to balance current/power. The method includes disposing a first switch module having a first gate terminal, a first drain terminal and a first source terminal, disposing a second switch module having a second gate terminal, a second drain terminal and a second source terminal in parallel with the first switch module, and disposing a first drain interconnection module coupled to the first drain terminal and a second gate interconnection module coupled to the second gate terminal to have inductive coupling to balance current flowing through the first switch module and the second switch module. Further, the method includes disposing a second drain interconnection module coupled to the second drain terminal and a first gate interconnection module coupled to the first gate terminal to have inductive coupling.

Aspects of the disclosure provide an apparatus having a power module. The power module includes a first switch module and a second switch module. The first switch module has a first gate terminal, a first drain terminal and a first source terminal. The first drain terminal is coupled to a first node via a first drain interconnection module, the first source terminal is coupled to a second node via a first source interconnection module, and the first gate terminal is coupled to a first control node via a first gate interconnection module to receive a first control signal. The second switch module has a second gate terminal, a second drain terminal and a second source terminal. The second drain terminal is coupled to the first node via a second drain interconnection module, the second source terminal is coupled to the second node via a second source interconnection module, and the second control terminal is coupled to a second control node via a second gate interconnection module to receive a second control signal. The first drain interconnection module and the second gate interconnection module are inductively coupled and the second drain interconnection module and the first gate interconnection module are inductively coupled to balance current flowing through the first switch module and the second switch module.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
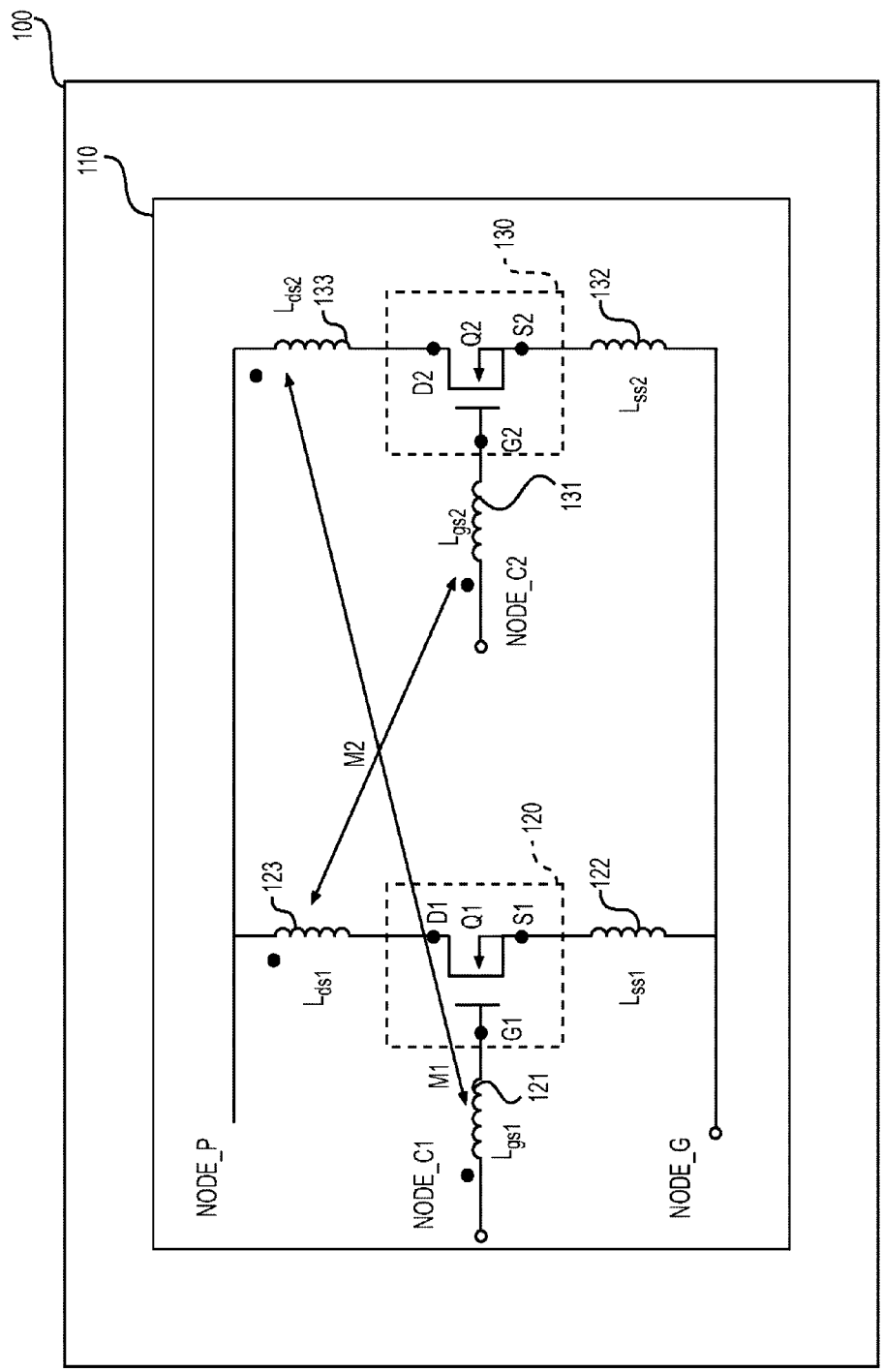
FIG. 1 shows a diagram of a system 100 according to an embodiment of the disclosure.

FIG. 1 shows a diagram of a system 100 according to an embodiment of the disclosure. The system 100 includes a power module 110 that uses mutual inductance coupling to balance current and/or power in parallel components.

The system 100 can be any suitable system that requires a relatively large power, such as a hybrid vehicle, an electric vehicle, a wind energy system, a printing system, and the like. During operation, in an example, the power module 110 needs to provide a relatively large current, such as in the order of Ampere and the like. In an embodiment, the power module 110 is configured to use parallel components to share the relatively large current load.

In an embodiment, the power module 110 includes a power converter circuit, such as a DC-to-AC inverter, an AC-to-DC rectifier, and the like, and is implemented using semiconductor switching devices. The semiconductor switching devices form a plurality of switchable current paths to share the current load. According to an aspect of the disclosure, the semiconductor switching devices may have wide parameter variations, such as threshold voltage (Vth) variations, on-resistance Rds(on) variations, and the like due to manufacturing process. The parameter variations can cause unbalanced current/power on the plurality of switchable current paths. According to an aspect of the disclosure, mutual inductance coupling is used to improve current/power balance among the plurality of switchable current paths.

In the FIG. 1 example, the power module 110 has one or more control nodes NODE_C1-NODE_C2, a first power node NODE_P and a second power node NODE_P. Further, the power module 110 includes a plurality of switch modules, such as a first switch module 120, a second switch module 130 and the like that. The switch modules are coupled in parallel to the control nodes and the power nodes using interconnection components, such as wires, busbars and the like. The switch modules are configured to switch on/off current paths between the first power node NODE_P and the second power node NODE_G based on control signals received at the control nodes NODE_C1-NODE_C2. In an example, the control nodes NODE_C1-NODE_C2 are coupled together to receive a same control signal. In another example, the control nodes NODE_C1-NODE_C2 are separate nodes to receive different control signals.

Each switch module can include one or more transistors. When multiple transistors are used in a switch module, the multiple transistors can be arranged in various topologies to act as a switch.

Specifically, in the FIG. 1 example, the first switch module 120 includes a first transistor Q1, and the second switch module 130 includes a second transistor Q2. The first transistor Q1 and the second transistor Q2 can be any suitable transistors, such as metal-oxide-semiconductor field effect transistors (MOSFET) and the like. In an example, the first transistor Q1 and the second transistor Q2 are SiC MOSFET transistors that may have relatively wide parameter variations due to manufacturing process.

Further, in the FIG. 1 example, the first transistor Q1 has a gate terminal G1, a source terminal S1 and a drain terminal D1. The gate terminal G1 is coupled to the first control node NODE_C1 via an interconnection component 121, the drain terminal D1 is coupled to the first power node NODE_P via an interconnection component 123, and the source terminal S1 is coupled to the second power node NODE_G via an interconnection component 122. Similarly, the second transistor Q2 has a gate terminal G2, a source terminal S2 and a drain terminal D2. The gate terminal G2 is coupled to the first control node NODE_C2 via an interconnection component 131, the drain terminal D2 is coupled to the first power node NODE_P via an interconnection component 133, and the source terminal S2 is coupled to the second power node NODE_G via an interconnection component 132.

According to an aspect of the disclosure, the interconnection components introduce parasitic inductances that influence the switching operation of the power module 110. For example, the interconnection component 121 introduces an inductance Lgs1, the interconnection component 122 introduces an inductance Lss1, the interconnection components 123 introduces an inductance Lds1, the interconnection component 131 introduces an inductance Lgs2, the interconnection component 132 introduces an inductance Lss2 and the interconnection component 133 introduces an inductance Lds2.

In addition, according to an aspect of the disclosure, the interconnection components are purposely mutual coupled to introduce mutual coupling parasitic inductances to balance current/power among the switch modules in the power module 110. Specifically, in the FIG. 1 example, the interconnection component 121 and the interconnection component 133 are purposely mutually coupled to introduce a mutual coupling parasitic inductance having a mutual coupling coefficient M1; and the interconnection component 123 and the interconnection component 131 are purposely mutually coupled to introduce a mutual coupling parasitic inductance having a mutual coupling coefficient M2.

According to an aspect of the disclosure, the mutual coupling is suitably designed such as the mutual coupling parasitic inductance improves current/power balance among the switch modules. In the FIG. 1 example, when the mutual coupling coefficients M1 and M2 are negative values, the mutual coupling parasitic inductances can improve current/power balance among the switch modules in the power module 110. In an example, at a time to switch on the first transistor Q1 and the second transistor Q2, a first current flowing through the first transistor Q1 (also flowing through the interconnection module 123) increases faster and is larger than a second current flowing through the second transistor Q2. The mutual coupling inductance between the interconnection component 123 and the interconnection component 131 then causes a voltage increase at the gate terminal G2 of the second transistor Q2, and thus turns on the second transistor Q2 more, and increases the second current flowing through the second transistor Q2. When the second current flowing through the second transistor Q2 (also flowing through the interconnection module 133) increases faster and is larger than the first current flowing through the first transistor Q1, the mutual coupling inductance between the interconnection component 133 and the interconnection component 121 causes a voltage increase at the gate terminal G1, and thus turns on the first transistor Q1 more, and increases the first current flowing through the first transistor Q1.

Similarly, at a time to switch off the first transistor Q1 and the second transistor Q2, the transient current flowing through the first transistor Q1 and the second transistor Q2 is balanced due to the mutual inductance coupling.

According to an aspect of the disclosure, when the first transistor Q1 and the second transistor Q2 are SiC MOSFET transistors, the on-resistance Rds(on) of the SiC MOSFET transistor has positive temperature coefficient, and thus the SiC MOSFET transistors intrinsically have negative feedback. Variations of the on-resistance Rds(on) may cause unbalance in the steady-state current, and the negative feedback of the on-resistance Rds(on) self-balances the steady-state current in the first transistor Q1 and the second transistor Q2.

Further, variations in the threshold voltage Vth may cause unbalance in the transient current. The threshold voltage Vth has negative temperature coefficient, and thus can cause a positive feedback and the unbalance in the transient current. The mutual inductance coupling technique can be used to balance the transient current at switching on/off time.

It is noted that the power module 110 can be implemented by various technology. In an example, switch modules, such as the first switch module 120, the second switch module 130, and the like, are implemented as bare dies, and the interconnection modules are implemented as wires and/or busbars. The switch modules, the interconnection modules and other suitable components are assembled in a package to form the power module 110. In another example, the switch modules are discrete devices that are assembled in separate packages, and the switch modules are interconnected by wires and busbars. In another example, the switch modules are integrated on an integrated circuit (IC) chip, and the interconnection modules are implemented as wires on the IC chip using IC manufacturing technology.

Figure 2:
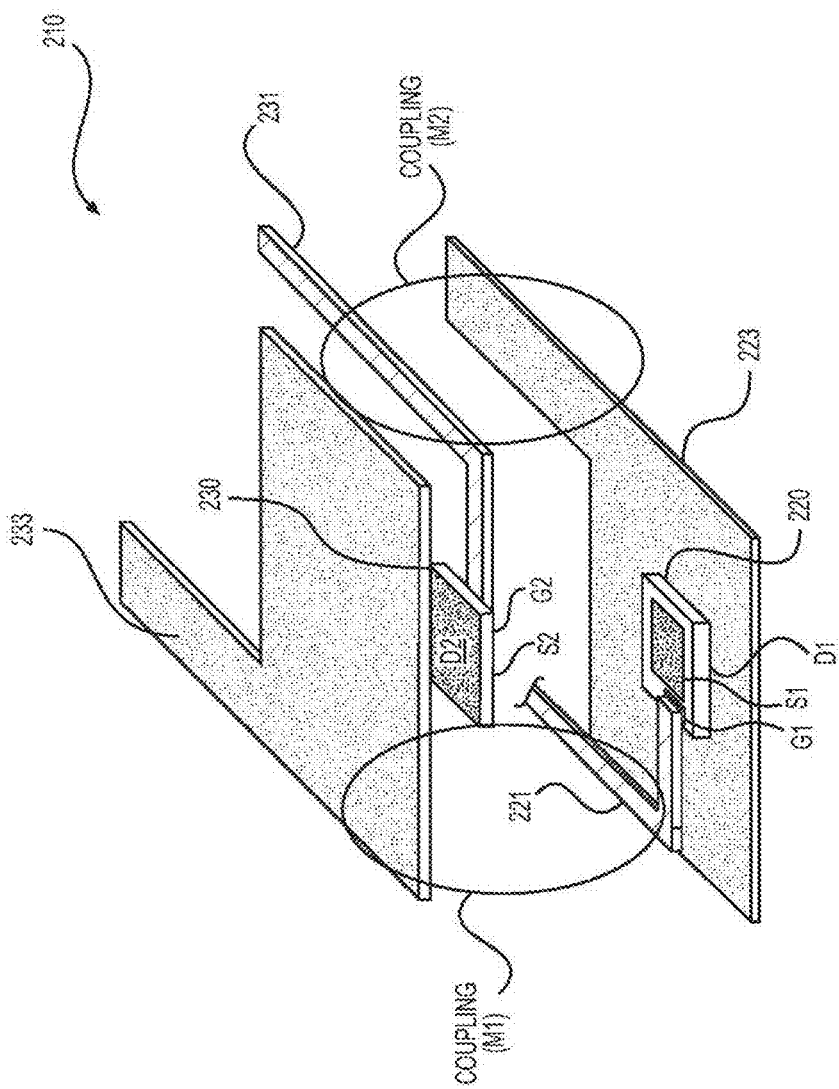
FIG. 2 shows an exploded view in a power module 210 according to an embodiment of the disclosure.

FIG. 2 shows a plot for an exploded view in a power module 210 according to an embodiment of the disclosure. In an embodiment, the power module 110 in FIG. 1 is implemented as the power module 210 in FIG. 2. The power module 210 includes switch modules, such as a first switch module 220, a second switch module 230, and the like that are implemented using bare dies. Further, the power module 210 includes interconnection modules, such as interconnection modules 221, 223, 231, 233 and the like, that are implemented using busbars. The power module 210 is implemented in the form of a package in an example.

For example, the first switch module 220 is a first bare die having a first transistor implemented using a SiC MOSFET technology. Thus, the drain terminal D1 of the first transistor is formed, for example as a bond pad, on the substrate of the first bare die, and the gate terminal G1 and the source terminal S1 of the first transistor are formed, for example as bond pads on the face side (opposite side of the substrate) of the first bare die.

Similarly, the second switch module 230 is a second bare die having a second transistor implemented using the SiC MOSFET technology. Thus, the drain terminal D2 of the second transistor is formed, for example as a bond pad, on the substrate of the second bare die, and the gate terminal G2 and the source terminal S2 of the second transistor are formed, for example as bond pads, on the face side (opposite side of the substrate) of the second bare die.

In an embodiment, the first bare die and the second bare die are disposed face to face. The interconnection module 221 is connected to the gate terminal G1 of the first transistor, the interconnection module 231 is connected to the gate terminal G2 of the second transistor, the interconnection module 223 is connected to the drain terminal D1 of the first transistor, and the interconnection module 231 is connected to the drain terminal D2 of the second transistor.

Further, in the embodiment, the interconnection module 221 and the interconnection module 233 are disposed to have a mutual coupling parasitic inductance having a mutual coupling coefficient M1. For example, the interconnection module 221 and the interconnection module 233 are disposed nearby, such that a current change in one of the interconnection modules can induce a voltage on the other interconnection module. In addition, the interconnection module 231 and the interconnection module 223 are disposed to have a mutual coupling parasitic inductance having a mutual coupling coefficient M2. For example, the interconnection module 223 and the interconnection module 231 are disposed nearby, such that a current change in one of the interconnection modules can induce a voltage in the other interconnection module. In an example, the mutual coupling parasitic inductance is suitably designed to improve transient current/power balance at the time of switching on/off the first and second transistors.

It is noted that, for ease and simplicity, the power module 210 includes other suitable components that are not shown in FIG. 2. For example, the source terminals S1 and S2 are connected by a suitable interconnection module not shown, such as a bonding wire and the like. It is also noted that, the configuration of the dies and the busbars in FIG. 2 can be suitably modified. For example, the two dies can be disposed in a back to back manner in an example, or can be disposed side by side in an example.

Figure 3:
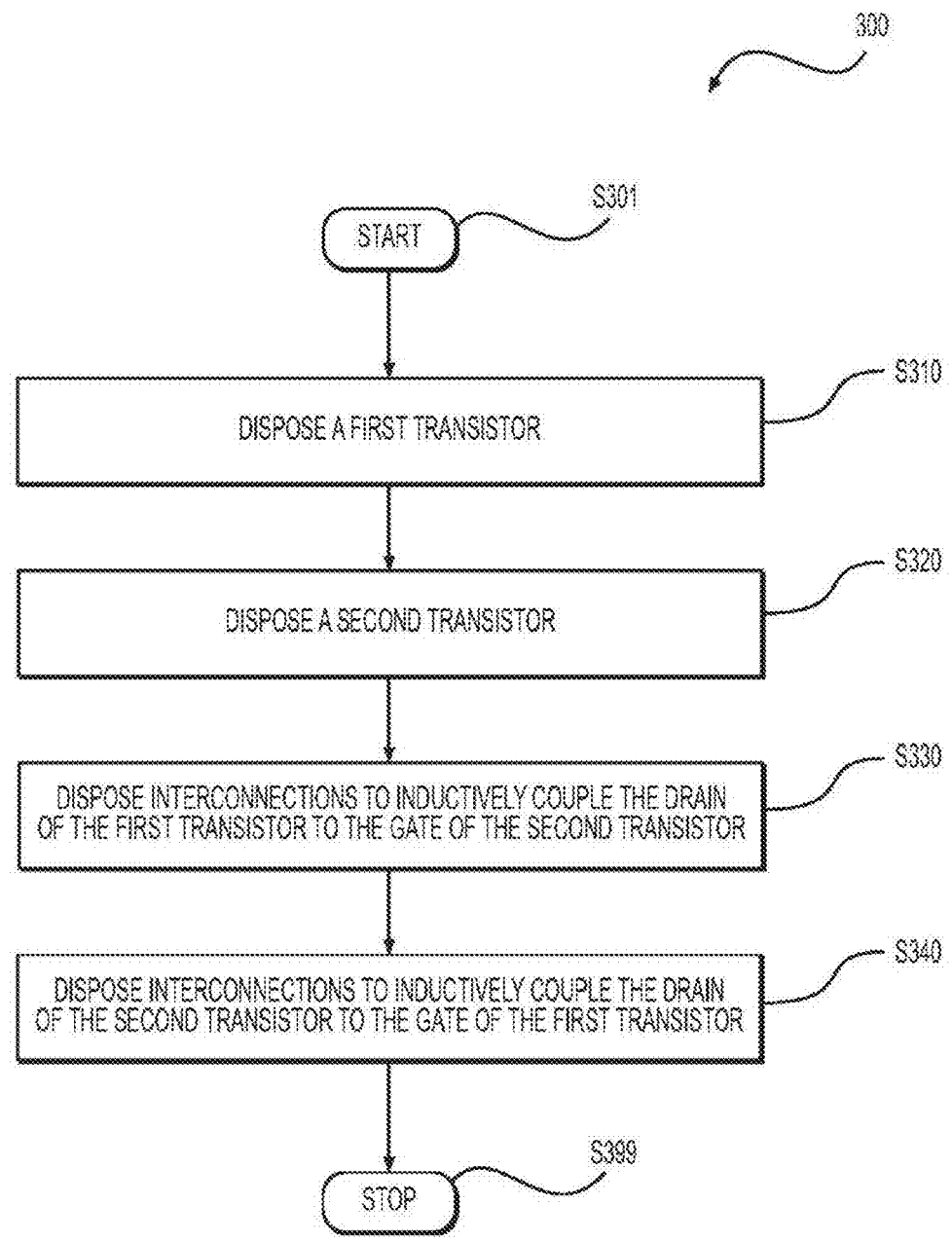
FIG. 3 shows a flow chart outlining a process example according to an embodiment of the disclosure.

FIG. 3 shows a flow chart outlining a process 300 according to an embodiment of the disclosure. In an example, the process 300 is executed to implement the power module 210. The process starts at S301, and proceeds to S310.

At S310, a first transistor is disposed. For example, the first transistor is implemented on a first bare die using the SiC MOSFET technology.

At S320, a second transistor is disposed. For example, the second transistor is implemented on a second bare die using the SiC MOSFET technology.

At S330, interconnections are disposed to inductively couple the drain terminal of the first transistor to the gate terminal of the second transistor. In the FIG. 2 example, the interconnection module 223 connects with the drain terminal of the first transistor, and the interconnection module 231 connects with the gate terminal of the second transistor. The interconnection module 223 and the interconnection module 231 are disposed, for example nearby, to be inductively coupled.

At S340, interconnections are disposed to inductively couple the drain terminal of the second transistor to the gate terminal of the first transistor. In the FIG. 2 example, the interconnection 233 module connects with the drain terminal of the second transistor, and the interconnection module 221 connects with the gate terminal of the first transistor. The interconnection module 233 and the interconnection module 221 are disposed, for example nearby, to be inductively coupled. Then the process proceeds to S399 and terminates.

It is noted that the process 300 can include other suitable steps to implement a power module. Further, the steps in the process 300 can be executed at the same time or in a different order.

Figure 4:
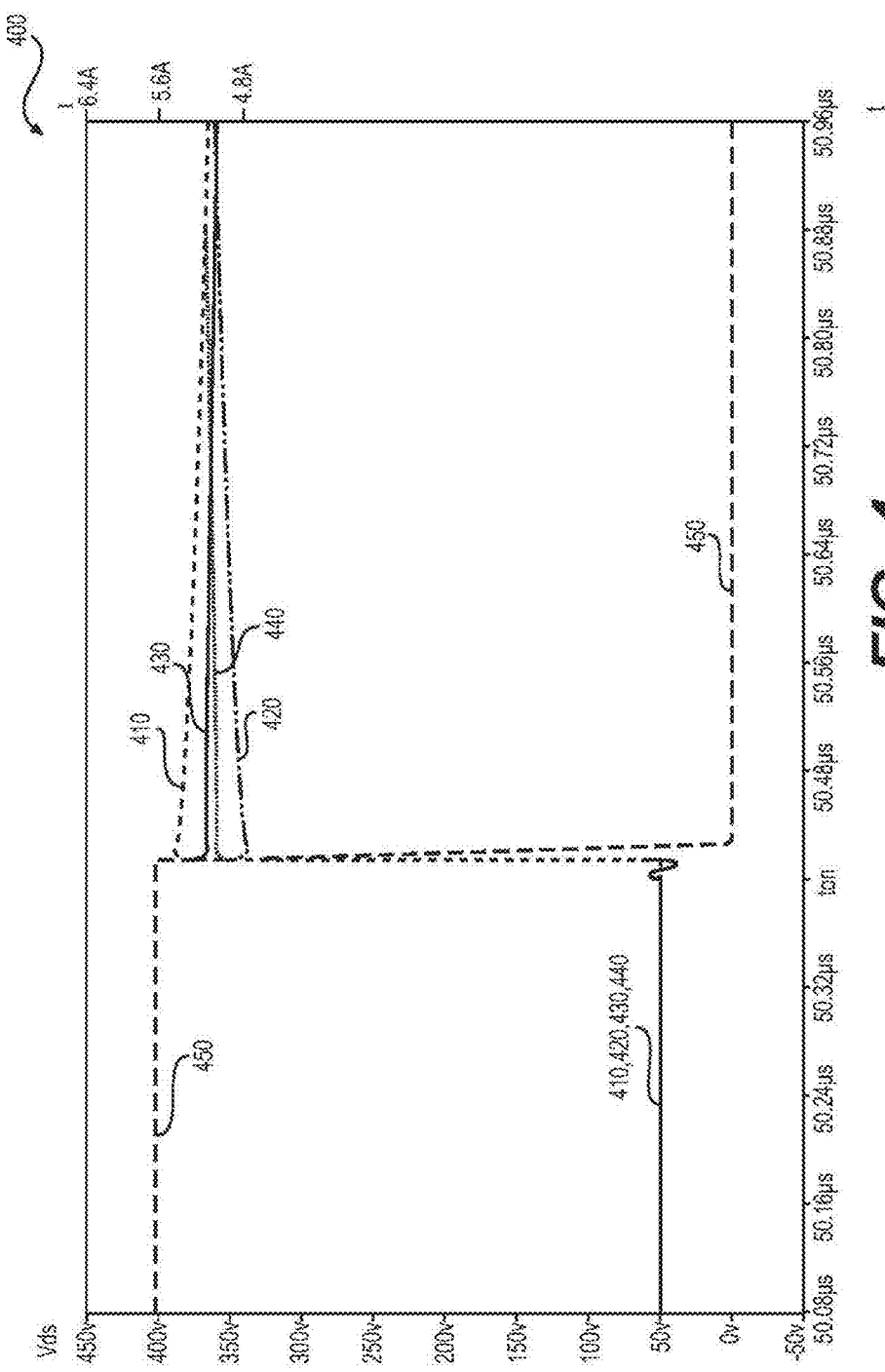
FIGS. 4 and 5 show plots of simulation results according to an embodiment of the disclosure.

FIG. 4 shows a plot 400 of simulation result according to an embodiment of the disclosure. For example, the plot 400 shows voltage and current changes with or without mutual coupling parasitic inductance when a power module with parallel transistors is switched on. The X-axis shows time, and the Y-axis shows voltage and current values.

The plot 400 includes five waveforms 410-450. The waveform 410 (in medium dashed line) shows drain current of the first transistor without mutual coupling parasitic inductance, the waveform 420 (in long-short dashed line) shows drain current of the second transistor without mutual coupling parasitic inductance, the waveform 430 (in solid line) shows drain current of the first transistor with mutual coupling parasitic inductance, the waveform 440 (in short dashed line) shows drain current of the second transistor with mutual coupling parasitic inductance, and the waveform 450 (in long dashed line) shows the drain-source voltage Vds.

As shown in FIG. 4, at time ton, the first transistor and the second transistor are switched on. Without mutual coupling parasitic inductance, the transient current in the first transistor and the transient current in the second transistor have relatively large difference. With mutual coupling parasitic inductance, the transient current difference in the first transistor and the second transistor is reduced.

Figure 5:
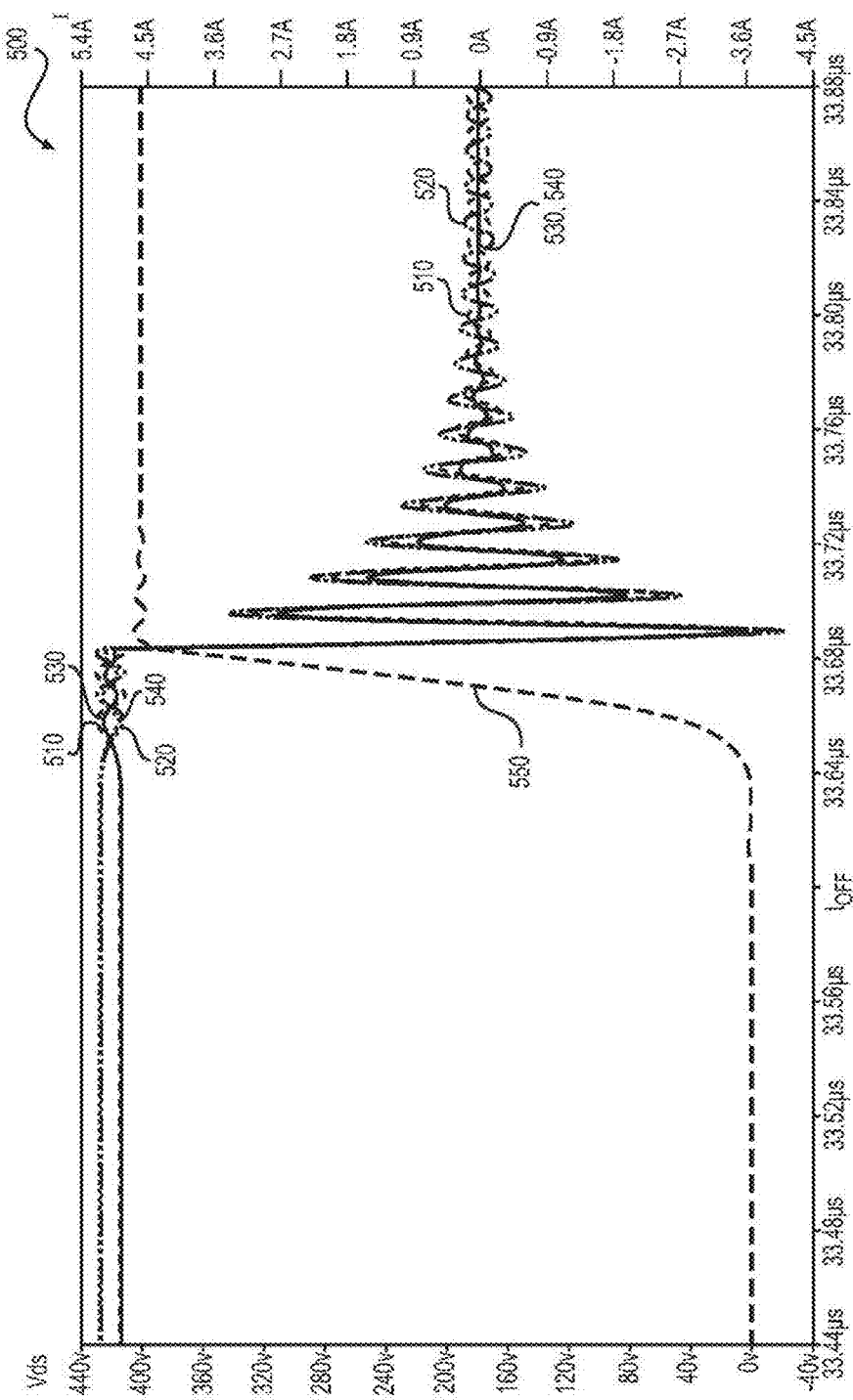

FIG. 5 shows a plot 500 of simulation result according to an embodiment of the disclosure. For example, the plot 500 shows voltage and current changes with or without mutual coupling parasitic inductance when a power module with parallel transistors is switched off. The X-axis shows time, and the Y-axis shows voltage and current values.

The plot 500 includes five waveforms 510-550. The waveform 510 (in medium dashed line) shows drain current of the first transistor without mutual coupling parasitic inductance, the waveform 520 (in long-short dashed line) shows drain current of the second transistor without mutual coupling parasitic inductance, the waveform 530 (in solid line) shows drain current of the first transistor with mutual coupling parasitic inductance, the waveform 540 (in short dashed line) shows drain current of the second transistor with mutual coupling parasitic inductance, and the waveform 550 (in long dashed line) shows the drain-source voltage Vds.

As shown in FIG. 5, at time toff, the first transistor and the second transistor are switched off. Without mutual coupling parasitic inductance, the transient current in the first transistor and the transient current in the second transistor have relatively large difference as shown by the waveforms 510 and 520. With mutual coupling parasitic inductance, the transient current difference in the first transistor and the second transistor is reduced as shown by the waveforms 530 and 540.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A power circuit, comprising:
a first switch module having a first gate terminal, a first drain terminal and a first source terminal, the first drain terminal being coupled to a first node via a first drain interconnection module, the first source terminal being coupled to a second node via a first source interconnection module, and the first gate terminal being coupled to a first control node via a first gate interconnection module to receive a first control signal; and
a second switch module having a second gate terminal, a second drain terminal and a second source terminal, the second drain terminal being coupled to the first node via a second drain interconnection module, the second source terminal being coupled to the second node via a second source interconnection module, and the second gate terminal being coupled to a second control node via a second gate interconnection module to receive a second control signal, the first drain interconnection module and the second gate interconnection module being inductively and directly coupled to balance current flowing through the first switch module and the second switch module.

2. The power circuit of claim 1, wherein the second drain interconnection module and the first gate interconnection module are inductively coupled.

3. The power circuit of claim 1, wherein the first drain interconnection module and the second gate interconnection module are disposed to have a negative mutual coupling coefficient.

4. The power circuit of claim 1, wherein the first drain interconnection module and the second gate interconnection module are inductively coupled to balance transient current flowing through the first switch module and the second switch module when the first and second switch modules are switched on/off.

5. The power circuit of claim 1, wherein the first switch module includes a first SiC metal-oxide-semiconductor field effect transistor and the second switch module includes a second SiC metal-oxide-semiconductor field effect transistor.

6. The power circuit of claim 1, wherein the first switch module is on a first die and the second switch module is on a second die.

7. The power circuit of claim 6, wherein the first die and the second die are assembled in a package face to face.

8. A method for current balancing, comprising:
disposing a first switch module having a first gate terminal, a first drain terminal and a first source terminal;
disposing a second switch module having a second gate terminal, a second drain terminal and a second source terminal in parallel with the first switch module; and
disposing a first drain interconnection module coupled to the first drain terminal and a second gate interconnection module coupled to the second gate terminal to have inductive and direct coupling between the first drain interconnection module and the second gate interconnection module to balance current flowing through the first switch module and the second switch module.

9. The method of claim 8, further comprising:
disposing a second drain interconnection module coupled to the second drain terminal and a first gate interconnection module coupled to the first gate terminal to have inductive coupling.

10. The method of claim 8, wherein disposing the first drain interconnection module and the second gate interconnection module to have inductive coupling to balance current flowing through the first switch module and the second switch module further comprises:
disposing the first drain interconnection module and the second gate interconnection module to have a negative mutual coupling coefficient.

11. The method of claim 8, wherein disposing the first drain interconnection module and the second gate interconnection module to have inductive coupling to balance current flowing through the first switch module and the second switch module further comprises:
disposing the first drain interconnection module and the second gate interconnection module to have inductive coupling to balance transient current flowing through the first switch module and the second switch module when the first and second switch modules are switched on/off.

12. The method of claim 8, wherein
disposing the first switch module including a first SiC metal-oxide-semiconductor field effect transistor; and
disposing the second switch module including a second SiC metal-oxide-semiconductor field effect transistor.

13. The method of claim 8, wherein
disposing the first switch module on a first die; and
disposing the second switch module on a second die.

14. The method of claim 13, wherein
assembling the first die and the second die in a package face to face.

15. An apparatus, comprising:
a power module that includes:
a first switch module having a first gate terminal, a first drain terminal and a first source terminal, the first drain terminal being coupled to a first node via a first drain interconnection module, the first source terminal being coupled to a second node via a first source interconnection module, and the first gate terminal being coupled to a first control node via a first gate interconnection module to receive a first control signal; and a second switch module having a second gate terminal, a second drain terminal and a second source terminal, the second drain terminal being coupled to the first node via a second drain interconnection module, the second source terminal being coupled to the second node via a second source interconnection module, and the second gate terminal being coupled to a second control node via a second gate interconnection module to receive a second control signal, the first drain interconnection module and the second gate interconnection module being inductively and directly coupled to balance current flowing through the first switch module and the second switch module.

16. The apparatus of claim 15, wherein the second drain interconnection module and the first gate interconnection module are inductively coupled.

17. The apparatus of claim 15, wherein the first drain interconnection module and the second gate interconnection module are disposed to have a negative mutual coupling coefficient.

18. The apparatus of claim 15, wherein the first drain interconnection module and the second gate interconnection module are inductively coupled to balance transient current flowing through the first switch module and the second switch module when the first and second switch modules are switched on/off.

19. The apparatus of claim 15, wherein the first switch module includes a first SiC metal-oxide-semiconductor field effect transistor and the second switch module includes a second SiC metal-oxide-semiconductor field effect transistor.

20. The apparatus of claim 15, wherein the first switch module is on a first die and the second switch module is on a second die.

* * * * *